(12) United States Patent
Ahladas et al.

(10) Patent No.: US 9,893,644 B1
(45) Date of Patent: Feb. 13, 2018

(54) ELECTRIC POWER DEVICES WITH AUTOMATICALLY ESTABLISHED INPUT VOLTAGE CONNECTION CONFIGURATION

(71) Applicant: INTERNATIONAL BUSINESS MACHINES CORPORATION, Armonk, NY (US)

(72) Inventors: Steven J. Ahladas, Poughkeepsie, NY (US); Kevin R. Covi, Glenford, NY (US); Luke L. Jenkins, Poughkeepsie, NY (US); Robert B. Schlak, Hyde Park, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/351,817

(22) Filed: Nov. 15, 2016

(51) Int. Cl.
*H02M 1/10* (2006.01)
*H02M 7/06* (2006.01)
*G01R 19/165* (2006.01)

(52) U.S. Cl.
CPC ........ *H02M 7/06* (2013.01); *G01R 19/16547* (2013.01)

(58) Field of Classification Search
CPC ......... H02M 3/33592; H02M 3/33569; H02M 2001/342; H02M 1/44; Y02B 70/1433
USPC .. 363/20, 21.02, 21.08, 21.12, 21.14, 21.18, 363/56.11, 97, 142, 143; 318/490, 798
See application file for complete search history.

(56) References Cited

U.S. PATENT DOCUMENTS

| | | | |
|---|---|---|---|
| 5,162,984 A | 11/1992 | Castagnet et al. | |
| 5,172,291 A | 12/1992 | Bakely et al. | |
| 5,903,145 A | 5/1999 | Hemminger et al. | |
| 8,207,699 B2 * | 6/2012 | Naiman | H02P 27/04 310/159 |

(Continued)

FOREIGN PATENT DOCUMENTS

| | | |
|---|---|---|
| CN | 101599703 A | 12/2009 |
| CN | 202978289 U | 6/2013 |

(Continued)

OTHER PUBLICATIONS

White et al., "Configuring Systems for Operation from Three-Phase AC Power", Electronics World (Apr. 2008), pp. 25-28.

(Continued)

*Primary Examiner* — Rajnikant Patel
(74) *Attorney, Agent, or Firm* — Margaret A. McNamara, Esq.; Kevin P. Radigan, Esq.; Heslin, Rothenberg, Farley & Mesiti, P.C.

(57) ABSTRACT

Electric power devices and control methods are provided which automatically select a line voltage or phase voltage of an AC voltage supply. The electric power device includes a switchable circuit, a sensor and a switch control. The switchable circuit connects to the AC voltage supply, and includes multiple switchable elements. The sensor ascertains a voltage level of the AC voltage supply, and the switch control automatically establishes a configuration of the switchable circuit through control of the multiple switchable elements. The switch control couples the electric power device in a line-line (delta) configuration to the AC voltage supply when the voltage level is in a first voltage range, and a line-neutral (wye) configuration when the voltage level is in a second voltage range.

16 Claims, 6 Drawing Sheets

(56) References Cited

U.S. PATENT DOCUMENTS

| | | | |
|---|---|---|---|
| 8,405,382 B2 | 3/2013 | King | |
| 8,531,262 B2 | 9/2013 | Ahuja et al. | |
| 8,598,836 B1 * | 12/2013 | Rabinovich | H02P 1/28 318/771 |
| 8,659,881 B2 | 2/2014 | Tsai et al. | |
| 8,716,885 B2 * | 5/2014 | Pfitzer | H02J 3/14 307/11 |
| 8,803,570 B2 * | 8/2014 | Smith | H03L 5/02 323/207 |
| 8,908,354 B2 | 12/2014 | Bald et al. | |
| 8,917,064 B2 | 12/2014 | Schlak | |
| 2016/0134205 A1 * | 5/2016 | Bock | H02P 1/265 318/778 |

FOREIGN PATENT DOCUMENTS

| | | |
|---|---|---|
| KR | 101141095 B1 | 5/2012 |
| WO | WO 2016/124916 A1 | 8/2016 |

OTHER PUBLICATIONS

Raritan Inc., "Deplying High Power to IT Equipment Racks", http://www.gocsc.com/UserFiles/File/Raritan/TA2011/raritan-wp-High_Power_.pdf (12 pages).

\* cited by examiner

ELECTRIC POWER DEVICES WITH AUTOMATICALLY ESTABLISHED INPUT VOLTAGE CONNECTION CONFIGURATION

BACKGROUND

The utility power specifications for different countries and/or regions of the world can vary. For instance, supplied power in the U.S., Japan, and other countries typically falls within a low-voltage range of, for instance, 200-208 V, and supplied power in Europe, as well as certain other regions of the world, often falls within a high-voltage range of 380-415 V. Thus, computers, servers, data centers, etc., in different countries or regions of the world may have different source voltages, and therefore may need to be configured differently for the particular country or region within which they are used. This increases complexity of product manufacture and distribution, as well as requires that an appropriate electric power device be used in the appropriate location. Should a change occur, for instance, should a computer or data center be relocated, then the utility power specification at the new location may require a change to the electric power device. For instance, different electric power devices may be manufactured for use in different geographic locations in view of the different utility power specifications of the locations, and it may be necessary to purchase or substitute a new electric power device (e.g., converter) to comply with a new utility power specification as a result of a product relocation.

SUMMARY

The shortcomings of the prior art are overcome and additional advantages are provided through the provision, in one aspect, of an electric power device which includes a switchable circuit, a sensor, and a switch control. The switchable circuit is to connect to an AC voltage supply, and includes multiple switchable elements. The sensor is to ascertain a voltage level of the AC voltage supply, and the switch control is to automatically establish a configuration of the switchable circuit based on the voltage level of the AC voltage supply, the switch control coupling the electric power device in a line-line (delta) configuration to the AC voltage supply when the voltage level is in a first voltage range, and a line-neutral (wye) configuration when the voltage level is in a second voltage range.

Advantageously, in one or more aspects, the electric power device, control method and computer program product provided herein incorporate a coupling connection facility which automatically establishes an input voltage coupling configuration. In particular, by initially ascertaining an input voltage level of an AC voltage supply, the switch control automatically establishes a configuration of the switchable circuit based on the voltage level of the AC voltage supply to connect the electric power device in a line-line (delta) configuration to the AC voltage supply when the voltage level is in a first voltage range, or a line-neutral (wye) configuration when the voltage level is in a second voltage range. In one or more embodiments, the electric power device may include a reconfigurable bridge rectifier which includes the switchable circuit, and in one or more other embodiments, the electric power device may be or include a power distribution unit. Advantageously, the automatic coupling configuration facility disclosed enables the use of a common, low-cost 200-240 V boost topology power supply. Further, the electric power devices disclosed may be employed worldwide, without external jumpers, switches, etc., to customize the connection of the device to the local voltage supply.

Few additional components are required to implement the automatic connection configuration facility, with the additional components or changes being small and at a low cost. Very little additional power loss is added by the facility disclosed herein. In one or more aspects, the automatic coupling configuration facility is particularly beneficial for IT equipment in the 3-5 kW or above range. Further, when implemented as a three-phase power supply, balanced three-phase power is obtained, which provides better line cord utilization. Further, the risk of hardware damage due to input overvoltage, such as using the wrong electric power device in the wrong country or region of the world, is eliminated.

In one or more implementations, the electric power device may further include a reconfigurable bridge rectifier to connect to the AC voltage supply, with the reconfigurable bridge rectifier including the switchable circuit. In one or more embodiments, the multiple switchable elements of the switchable circuit may include multiple silicon-controlled rectifiers, and the switch control may automatically enable or disable one or more silicon-controlled rectifiers of the multiple silicon-controlled rectifiers to couple the electric power device in the line-line (delta) configuration or the line-neutral (wye) configuration, dependent on the voltage level of the AC voltage supply. More particularly, in one or more implementations, the reconfigurable bridge rectifier may include multiple diodes connected in-series, with one phase input of the AC voltage supply being connected to the reconfigurable bridge rectifier between two diodes of the multiple diodes connected in-series, and wherein at least two silicon-controlled rectifiers of the multiple silicon-controlled rectifiers may be connected in-series, with another phase input of the AC voltage supply being connected to the reconfigurable bridge rectifier between the silicon-controlled rectifiers of the at least two silicon-controlled rectifiers.

In one or more embodiments, the AC voltage supply may include multiple phase lines and a neutral line, and the electric power device may be a single-phase power supply. In one or more other embodiments, the AC voltage supply may be a three-phase voltage supply, and the electric power device may be a three-phase power supply, with each phase of the three-phase power supply being connectable by the switch control for line-line operation or line-neutral operation.

In one or more embodiments, the electric power device includes a three-phase power distribution unit, where the AC voltage supply is a three-phase voltage supply, and the three-phase power distribution unit includes multiple outlet connectors which facilitate connecting multiple single-phase power supplies to the three-phase power distribution unit. By way of example, the multiple switchable elements of the three-phase power distribution unit may include multiple triacs gated by the switch control, the multiple triacs being connected between the three-phase voltage supply and the multiple outlet connectors. As a further example, the multiple switchable elements may include multiple relays activated by the switch control, with the multiple relays being connected between the three-phase voltage supply and the multiple outlet connectors.

In one or more implementations, the first voltage range is a low-voltage range, and the second voltage range is a high-voltage range, with the low-voltage range being a lower voltage range than the high-voltage range. By way of example, the low-voltage range may be or include 200-208 V, and the high-voltage range may be or include 380-415 V.

Methods and computer program products relating to one or more aspects are also described and claimed herein.

Additional features and advantages are realized through the techniques of the present invention. Other embodiments and aspects of the invention are described in detail herein and are considered a part of the claimed invention.

BRIEF DESCRIPTION OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Electric power devices, such as AC/DC power supplies and power distribution units (PDUs), need to operate based on available worldwide voltage ranges. Countries or regions of the world may generally be grouped into two line voltage ranges, with some countries falling within a low-voltage range of, for instance, 200-208 V, and others in a high-voltage range of, for instance, 380-415 V. By comparison, most power supplies, such as, for computers, servers, data centers, etc., utilize an input voltage supply in the range of 200-240 V. With an AC line voltage or input voltage in the low-voltage range, the electric power devices may connect in line-line (delta) configuration to draw line voltages from the supply, such as depicted in FIG. 1A.

Figure 1A:
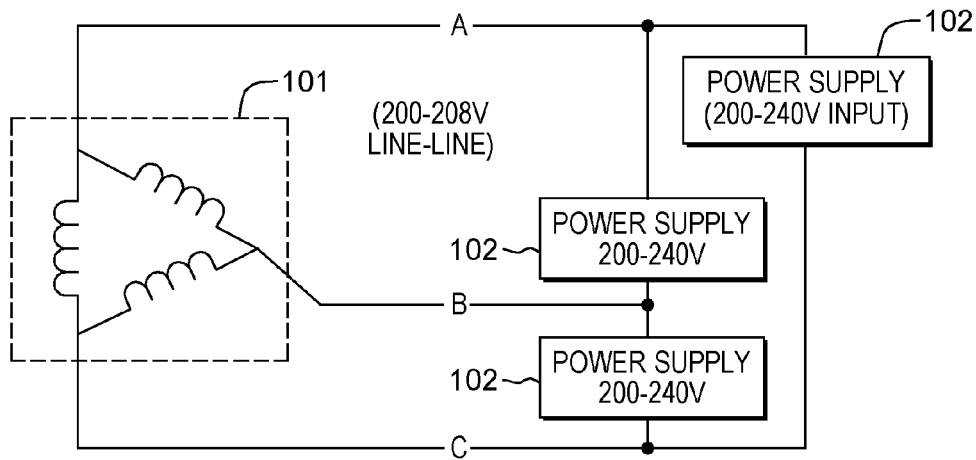
FIG. 1A is a schematic of one embodiment of a circuit which includes an AC voltage supply to which multiple power supplies connect in a line-line (or delta) configuration.

In particular, FIG. 1A illustrates one embodiment of an electric power circuit 100 with an input supply or AC voltage supply 101 having a line voltage in the low-voltage range of 200-208 V, and showing three separate power supplies 102 connected in line-line configuration, with one power supply being fed by a connection across lines A-B, another across lines B-C, and a third across lines A-C, as illustrated. The three-phase, line-line (delta) wire configuration depicted in FIG. 1A may typically be provided by building wiring for single-phase systems. However, power products above 3-5 kW are typically three-phase systems, and the product itself needs to provide the correct line-line (or line-neutral (wye)) input to the supplies.

Figure 1B:
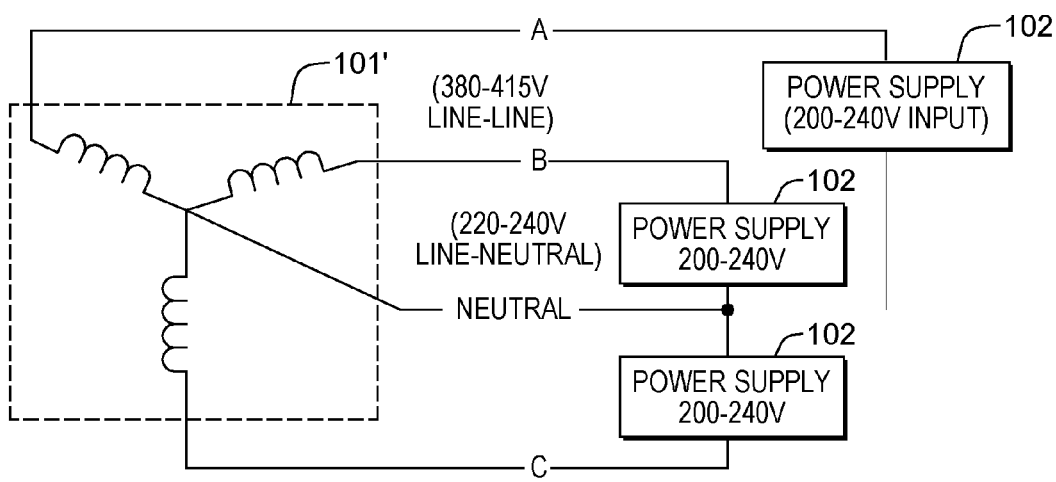
FIG. 1B is a schematic of one embodiment of a circuit which includes an AC voltage supply to which multiple power supplies connect in a line-neutral (or wye) configuration.

FIG. 1B depicts one embodiment of an electric power circuit 100' connected for a high-voltage range country, where the power supplies 102 are connected to the input supply 101' in line-neutral (wye) configuration. In this configuration, each power supply 102 of the electric power circuit 100' is connected across one of line A-neutral, line B-neutral, or line C-neutral, with the resultant phase voltage being equal to the line voltage (i.e., the line-line voltage) divided by the square root of 3, and so the power supply 102 input would be in the range of 220-240 V, that is, assuming a line voltage in the 380-415 range. Again, for power distribution components, devices in the range of 3-5 kW or less may employ single-phase power, and building wiring may provide the correct AC line voltage. For systems in the 3-5 kW range or larger, a three-phase voltage supply may be used, and either a line-line (delta) configuration or line-neutral (wye) configuration would be required for connecting the electric power device to the supply.

Figure 2:
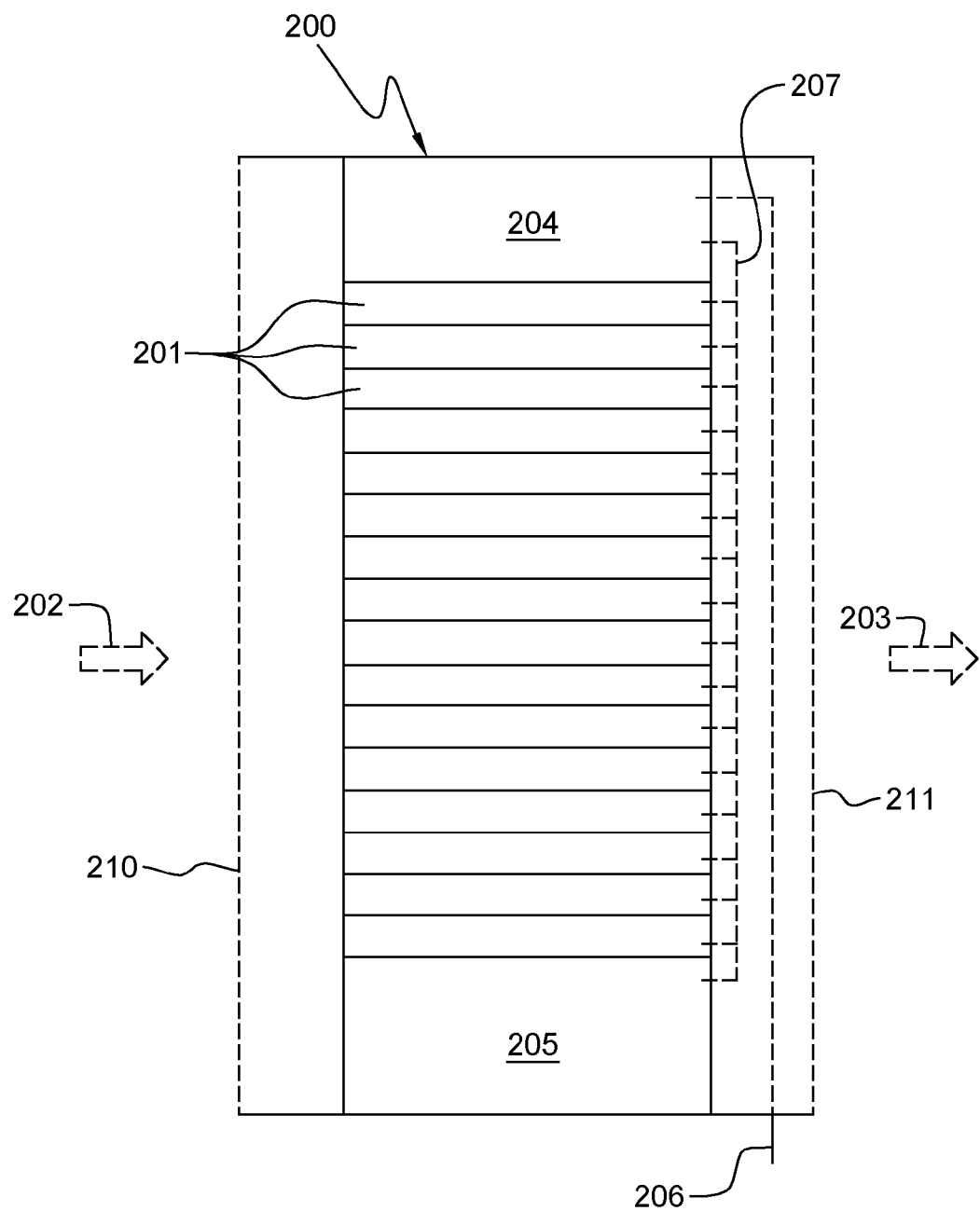
FIG. 2 is a cross-sectional elevational view of one embodiment of an electronics or IT rack which may include one or more electric power devices, in accordance with one or more aspects of the present invention.

As one application, the electric power device may be a power supply for an IT or electronics rack of, for instance, a data center. In another embodiment, the electric power device may be or include a power distribution unit of, for instance, an IT or electronics rack of a data center, and which may supply one or more power supplies within individual computers, subsystems, servers, drawers, blades, etc., of the rack. One embodiment of an electronics rack, generally denoted 200, is depicted in FIG. 2 by way of example.

In the embodiment shown, electronics rack 200 includes a plurality of electronics subsystems 201, which (in one embodiment) may be air-cooled by cool air 202 ingressing via louvered air inlet door 210, and exhausting out louvered air outlet door 211 as hot air 203. Electronics rack 200 also includes at least one bulk power assembly 204, which may include one or more power distribution units such as disclosed herein. One or more electronic subsystems 201 include, in one example, one or more processors, associated memory, input/output adapters, disk storage devices, and (in one or more embodiments) power supplies. Also illustrated in FIG. 2, the rack may include an I/O and disk expansion subsystem 205, which may have, in one detailed example, PCIe card slots and disk drivers for one or more electronic subsystems of the electronics rack.

In this rack example, a three-phase AC source feeds power via an AC power or line cord 206 to bulk power assembly 204, which may divide the supplied AC power at an appropriate power level for output via distribution cables 207 to the plurality of electronics subsystems 201. AC power cord 206 may supply, in one example, three phases for international 415 $V_{RMS}$, and may have a current limit rating of, for example, 100 amps. The number of electronic subsystems 201 installed in the electronics rack is variable and depends on customer needs.

One common solution for electronics racks to be operated in different parts of the world is to source two different power supplies and/or two different power distribution units (PDUs). As an example, with this solution, a power distribution unit would typically be factory configured or selected for the appropriate system supply voltage dependent on geography. Moving a system to a different geographic location supplied by a different supply voltage (in the other of the low-voltage range or high-voltage range) may be difficult. With this approach, costs increase due to the increased number of device parts, each with reduced volumes. Damage can occur if the wrong PDU is used in association with the currently available input voltage range.

Another solution would be to manually superimpose switches or jumpers on the power distribution unit. Unfortunately, such an approach could result in a misconfiguration, again resulting in damage to the device.

A further approach would be to employ wide-range (200-415 V) power supplies which always operate line-line (delta). The Vienna rectifier is a three-phase supply that can support this input range. Three single-phase rectifiers could also be used. The buck+boost and certain boost regulators can support this input range. The disadvantage to this solution is that larger-sized devices are required, resulting in a decreased efficiency, additional complexity, and increased costs.

In view of the above, disclosed herein (in one or more aspects) is an electric power device and method for automatically establishing an electric power device's coupling configuration to the AC voltage supply as required based on, for instance, a sensed input voltage, such as a line voltage of the AC voltage supply. By way of example, in one or more embodiments, the electric power device may be a power supply, and the automatically configuring may be performed in association with a bridge rectifier of the power supply. The bridge rectifier may be automatically configured for line-line or line-neutral operation, as required based on the sensed input voltage. For instance, the power supply may operate from a line-line (delta) configuration for a low-voltage range input voltage, and a line-neutral (wye) configuration for a high-voltage range input voltage. Advantageously, the solution disclosed herein enables the use of common, low-cost, 200-240 V boost topology supplies. A single worldwide part number is achieved, without the use of any external jumpers, switches, etc. Also, few additional components are added, so there is little effect on the total size or cost of the power device. In addition, any power losses due to the added circuitry are advantageously minor.

Generally stated, disclosed herein are electric power devices, methods, and computer program products, which facilitate automatically establishing a configuration of a switchable circuit to couple the electric power device to an AC voltage supply. For instance, an electric power device is provided which includes a switchable circuit, a sensor, and a switch control. The switchable circuit is to connect to the AC voltage supply, and includes multiple switchable elements. The sensor is to ascertain a voltage level of the AC voltage supply, and the switch control automatically establishes a configuration of the switchable circuit based on the voltage level of the AC voltage supply. The switch control couples the electric power device in a line-line (delta) configuration to the AC voltage supply when the voltage level is in a first voltage range, and a line-neutral (wye) configuration to the AC voltage supply when the voltage level is in a second voltage range.

In one or more embodiments, the electric power device includes a reconfigurable bridge rectifier to connect to the AC voltage supply. The reconfigurable bridge rectifier includes the switchable circuit. By way of example, the multiple switchable elements of the switchable circuit may include multiple silicon-controlled rectifiers. In such a case, the switch control automatically enables or disables one or more silicon-controlled rectifiers of the multiple silicon-controlled rectifiers to couple the electric power device in the line-line (delta) configuration or the line-neutral (wye) configuration, dependent on the voltage level of the AC voltage supply.

In one or more embodiments, the reconfigurable bridge rectifier may include multiple diodes connected in-series, with one phase input of the AC voltage supply being connected to the reconfigurable bridge rectifier between two diodes of the multiple diodes connected in-series, and at least two silicon-controlled rectifiers of the multiple silicon-controlled rectifiers may be connected in-series, with another phase input of the AC voltage supply being connected to the reconfigurable bridge rectifier between silicon-controlled rectifiers of the at least two silicon-controlled rectifiers.

By way of example, the AC voltage supply may include multiple phase lines, and a neutral line, and the electric power device may be a single-phase power supply. In one or more other embodiments, the AC voltage supply may be a three-phase voltage supply, and the electric power device may be a three-phase power supply. In such cases, each phase of the three-phase power supply is connectable line-line or line-neutral by the switch control controlling the multiple switchable elements.

In one or more embodiments, the electric power device is a three-phase power distribution unit, the AC voltage supply is a three-phase voltage supply, and the three-phase power distribution unit includes multiple outlets, or outlet connectors, which facilitate connecting multiple single-phase power supplies to the three-phase power distribution unit.

In one or more embodiments, the multiple switchable elements may include multiple triacs gated by the switch control. The multiple triacs may be connected between the input, three-phase voltage supply and the multiple outlet connectors. In one or more other embodiments, the multiple switchable elements may include multiple relays activated by the switch control. The multiple relays may be connected between the input, three-phase voltage supply and the multiple outlet connectors.

By way of example, the first voltage range may be a low-voltage range, and the second voltage range may be a high-voltage range, with the low-voltage range being lower than the high-voltage range. For instance, the low-voltage range may be, or may include, 200-208 V, and the high-voltage range may be, or may include, 380-415 V.

Figure 3:
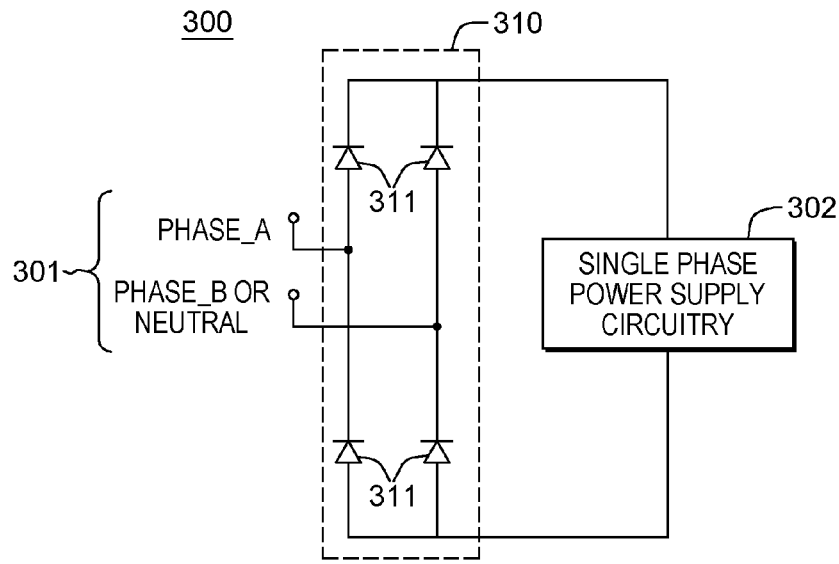
FIG. 3 depicts one embodiment of a single-phase power supply with a bridge rectifier coupling the single-phase power supply to an AC voltage supply, and which is to be modified in accordance with one or more aspects of the present invention.

As a reference, FIG. 3 depicts one embodiment of a typical power supply 300 which includes connections 301 to an AC voltage supply which includes a phase_A connection, and a phase_B or a neutral connection, dependent on the implementation. In addition to single-phase power supply circuitry 302, power supply 300 includes a bridge rectifier 310, which includes (in the depicted embodiment) four diodes 311 in a bridge circuit configuration to provide the same output polarity for either input polarity voltage signal, to facilitate converting an alternating current (AC) input to a direct current (DC) output.

Figure 4:
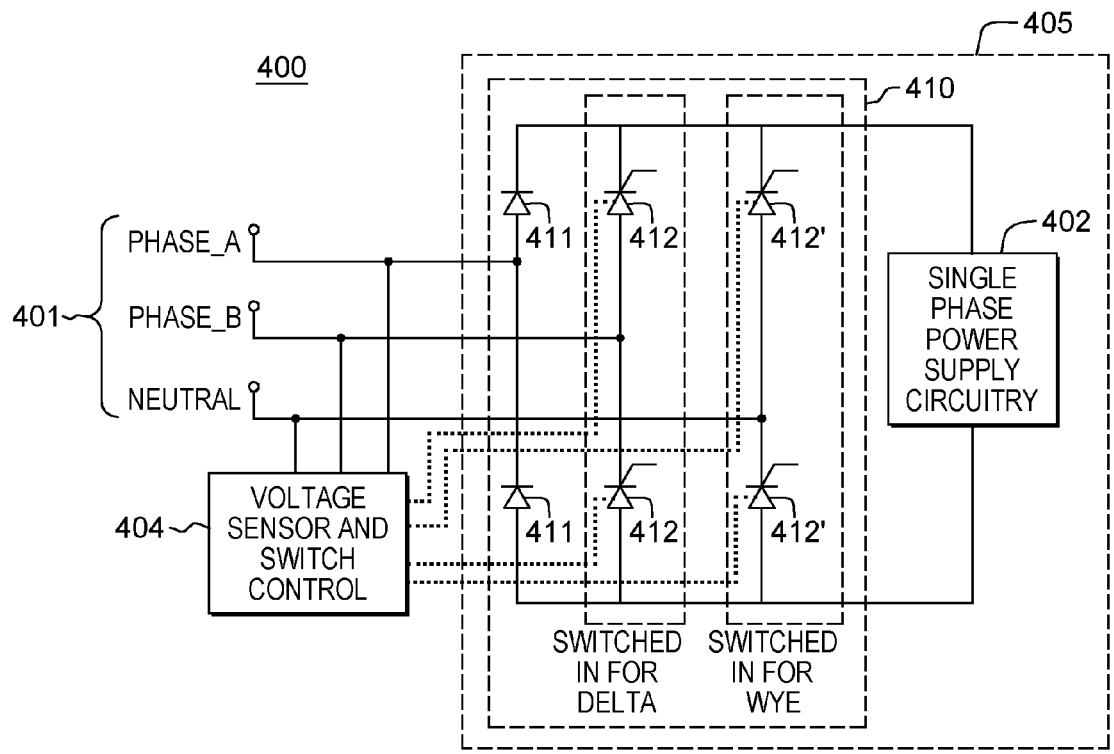
FIG. 4 depicts one embodiment of an electric power device to connect to an AC voltage supply, and which is configured as a single-phase power supply unit, in accordance with one or more aspects of the present invention.

In comparison, FIG. 4 depicts one embodiment of an electrical power device 400 configured as a single-phase power supply, in accordance with one or more aspects of the present invention. In this embodiment, three connections or wires 401, including phase_A, phase_B, and neutral of the AC voltage supply, are connected to the electric power device 400. In addition to single-phase power supply circuitry 402, electric power device 400 includes a reconfigurable bridge rectifier 410, as well as a voltage sensor and switch control 404. As illustrated, along with multiple series-connected diodes 411, the reconfigurable bridge rectifier 410 includes multiple silicon-controlled rectifiers 412, 412', configured as two different sub-circuits, one switched in for a line-line (delta) configuration connection, and the other switched in for a line-neutral (wye) connection configuration.

As explained, in one or more embodiments, a voltage level of the AC voltage supply on lines 401 is sensed to determine whether the voltage level is within a first voltage range or a second voltage range. In one or more embodiments, the voltage level sensed may be a line voltage of the AC voltage supply. Dependent on the sensed voltage level, the switch control 404 gates the silicon-controlled rectifiers 412, 412' to fire as appropriate to configure the power supply for either line-line operation or line-neutral operation. As noted, in one or more embodiments, line-line operation may be employed for a low-voltage range input supply, for instance, in the range of 200-208 V, and line-neutral operation may be employed for a high-voltage range input, for instance, in the range of 380-415 V.

Figure 5:
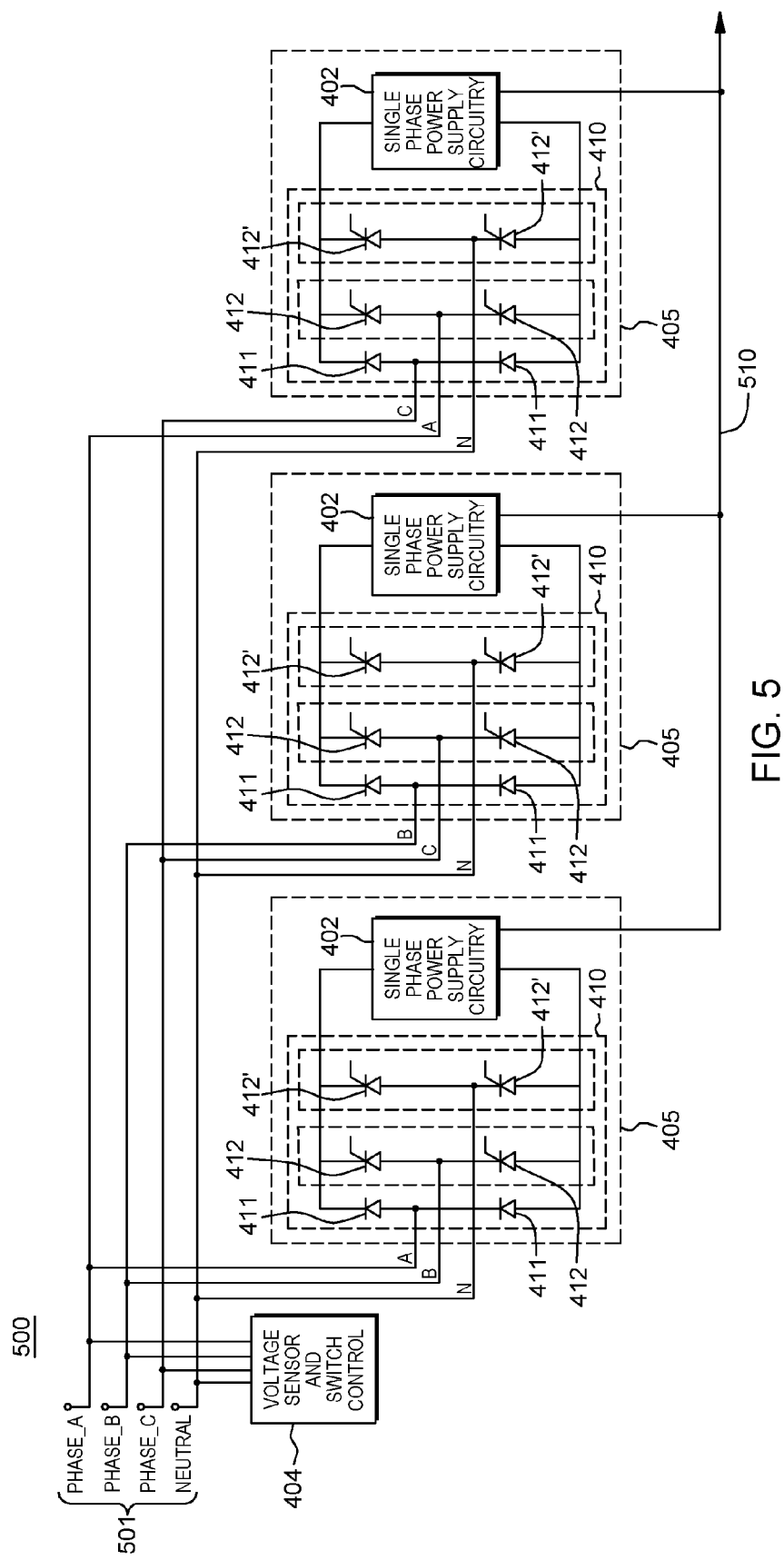
FIG. 5 depicts one embodiment of an electric power device to connect to a three-phase AC voltage supply, and which is configured as a three-phase power supply unit, in accordance with one or more aspects of the present invention.

Another embodiment of an electric power device 500 (in accordance with one or more aspects of the present invention) is depicted in FIG. 5, where the electric power device is, by way of example, a three-phase power supply which repeats in each of the phases the circuitry 405 of the single-phase power supply of FIG. 4. In this example, the three-phase power supply 500 is coupled to a three-phase voltage supply 501, which includes phase_A, phase_B, phase_C, and neutral. In the embodiment depicted, each circuitry 405 is connected to be configurable using a different line voltage and the neutral connection, with one circuit 405 being connected to phase_A, phase_B, and neutral, another connected to phase_B, phase_C, and neutral, and further connected to phase_C, phase_A, and neutral, as shown. The phases wired to the converters or bridge rectifiers are staggered to provide equal current on each phase. In this embodiment, each single-phase bridge rectifier 410 (or converter) may be configured with silicon-controlled rectifiers 412, 412' controlled by voltage sensor and switch control 404, as described above in connection with FIG. 4. The output of each circuitry 405 may be to a common output voltage bus 510.

Figure 6:
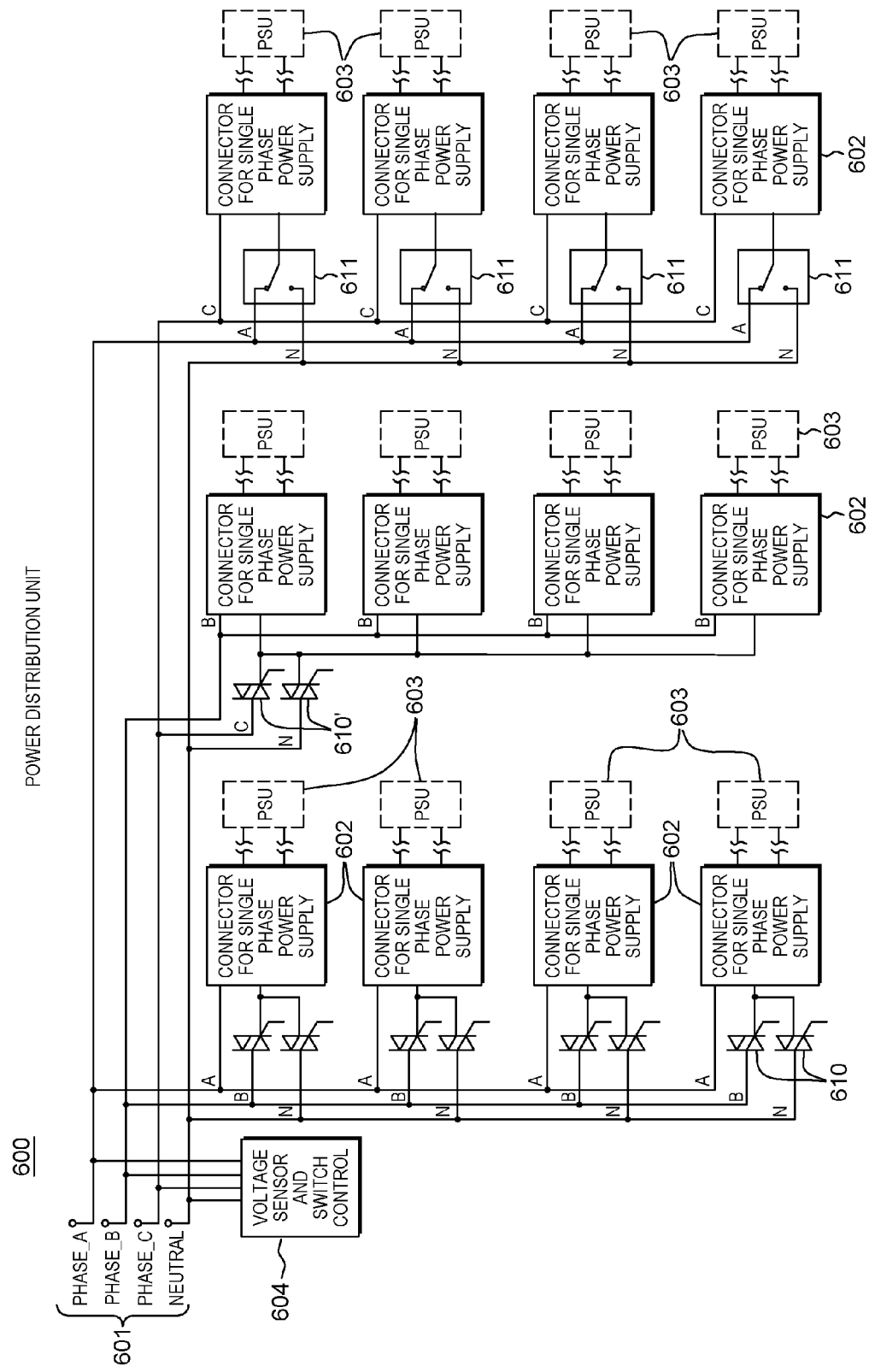
FIG. 6 is a schematic illustrating one embodiment of an electric power device configured as a power distribution unit, which is to connect to a three-phase AC voltage supply, and which illustrates (by way of example) the use of different types of switchable circuits, in accordance with one or more aspects of the present invention.

By way of further example, FIG. 6 depicts an additional embodiment of an electric power device 600, in accordance with one or more aspects of the present invention. In this embodiment, electric power device 600 is configured as a power distribution unit, such as might be used for an electronics or IT rack of a data center. As in the electric power device embodiment of FIG. 5, phase_A, phase_B, phase_C, and neutral connections 601 of or to a three-phase voltage supply are provided, and each phase is shown to include multiple outlet connectors for single-phase power supply 602. In the example shown, each phase has four outlet connectors, for a total of twelve outlet connectors being provided by the power distribution unit to supply, for instance, twelve distinct, single-phase power supplies 603, which may be located remote to the power distribution unit (for instance, within individual subsystems of the electronics or IT rack). Any number of connectors may be provided by the power distribution unit. In another embodiment, three connectors per phase may be provided, for a total of nine outlet connectors powering nine distinct power supply units 603.

The electric power device 600 further includes a voltage sensor and switch control 604 to sense an input voltage level of the AC voltage supply, such as a line voltage, as well as to provide operation of the power distribution unit in either a line-line configuration or line-neutral configuration.

By way of example, connectors for single-phase power supply 602 in one phase of the power distribution unit are shown connected to phase_A, and selectively coupled to either phase_B or neutral, dependent upon whether line-line or line-neutral operation is desired. In this configuration, multiple discrete triacs 610 may be employed as the switchable elements. Triacs 610 are semiconductor devices which are similar to silicon-controlled rectifiers, but allow current to flow in both directions. In the embodiment depicted, multiple connectors for single-phase power supply 602 are connected to another phase, phase_B, as well as selectively connectable to phase_C and the neutral line via triacs 610'. In this example, the pair of triacs 610' may be used to switch in unison all of the outlet connectors for single-phase power supply 602 in that phase. In such a case, triacs 610' may be larger triacs than triacs 610 associated with each of the connectors in the phase connected to phase A.

By way further example, in one or more embodiments, relays 611 may instead be employed, such as illustrated in the third phase of the power distribution unit of FIG. 6. In this configuration, each connector for single-phase power supply 602 in this phase is connected to phase C, and selectively connectable to either phase_A or neutral to allow for line-line or line-neutral operation as described herein.

Note with respect to FIG. 6, that the different switchable element configurations are provided by way of example only. In one or more embodiments, the same switchable element might be employed in each phase of the power distribution unit. Note also that the power distribution unit may contain other functions not shown, such as filtering, monitoring, fusing, etc.

From the above description, those of ordinary skill in the art will understand that the electric power device disclosed herein may take a variety of configurations, including that of a power supply or a power distribution unit. For instance, in one or more embodiments, a power supply may be provided to operate in either line-line or line-neutral operation using silicon-controlled rectifiers in the rectifier bridge. In one or more other embodiments, a power distribution unit may be provided with either line-line or line-neutral outlets, dependent on, for instance, the sensed voltage level of the AC voltage supply provided to the unit.

The aspects disclosed herein are particularly beneficial for IT equipment within or above the 3-5 kW range. The electric power devices and methods of control disclosed advantageously provide a lower-cost solution to the problem noted. Further, using a three-phase power supply such as described with reference to FIG. 5 provides balanced three-phase power and better line cord utilization. The devices disclosed herein also eliminate the risk of hardware damage due to an input overvoltage as a result of a miss-wiring of an electric power device to the supplied voltage.

Figure 7:
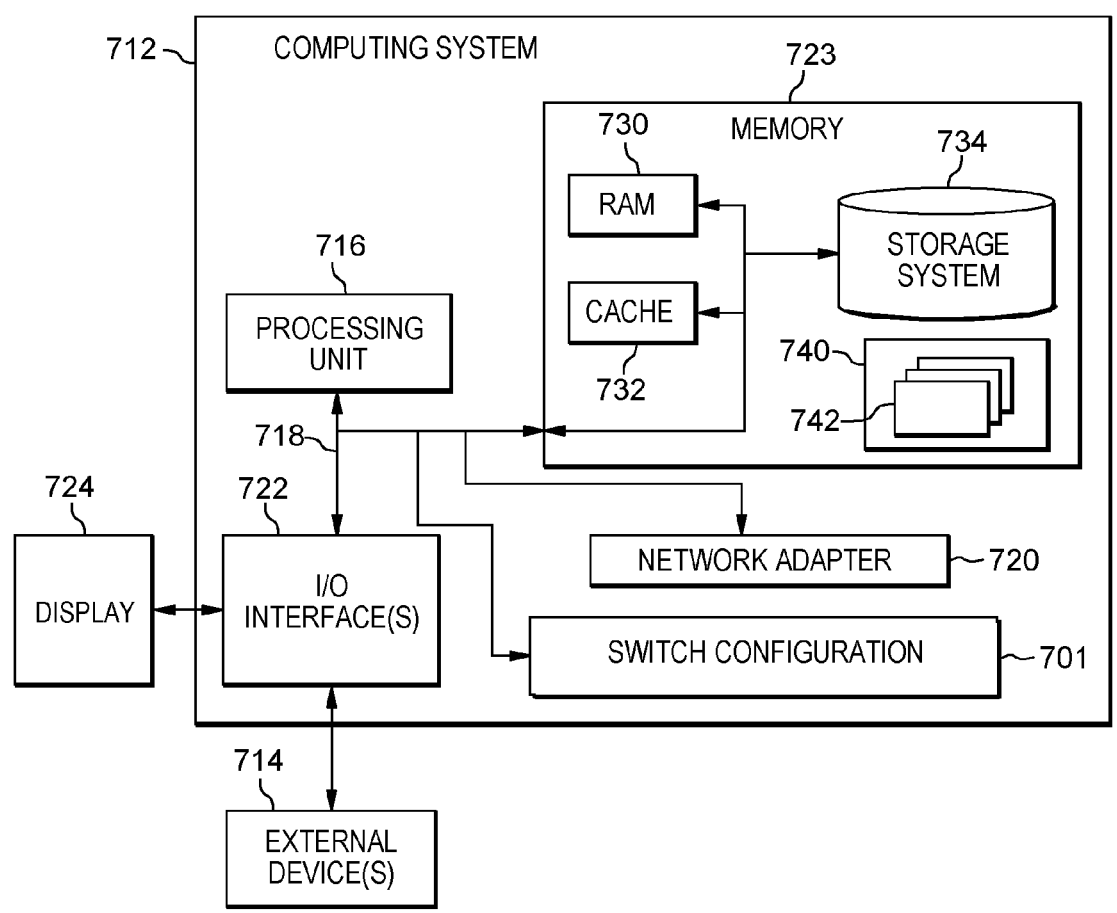
FIG. 7 depicts one embodiment of a computing system which may implement one or more of the sensing and control aspects of an electric power device, in accordance with one or more aspects of the present invention.

Referring next to FIG. 7, a schematic of an example of a processing system 700 is shown, which may be used to implement one or more aspects of the present invention, such as the voltage sensing and switch control. Processing system 700 is only one example of a suitable system and is not intended to suggest any limitation as to the scope of use or functionality of embodiments of the invention described herein. Regardless, processing system 700 is capable of being implemented and/or performing any of the functionality set forth herein above, such as the voltage sensing and switch control functionality discussed.

In processing system 700, there is a computing system 712, which may be described in the general context of computer system executing instructions, such as program modules. Generally, program modules may include routines, programs, objects, components, logic, data structures, and so on that perform particular tasks or implement particular abstract data types. One or more aspects of computing system 712 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 7, computing system 712 in processing system 700 is shown in the form of a general-purpose computing device. The components of detector/computing system 712 may include, but are not limited to, one or more processors or processing units 716, a system memory 723, and a bus 718 that couples various system components including system memory 723 to processor(s) 716.

Bus 718 represents one or more of any of several types of bus structures, including a memory bus or memory controller, a peripheral bus, an accelerated graphics port, and a processor or local bus using any of a variety of bus architectures. By way of example, and not limitation, such architectures include the Industry Standard Architecture (ISA), Micro Channel Architecture (MCA), Enhanced ISA (EISA), Video Electronics Standards Association (VESA), and Peripheral Component Interconnect (PCI).

Computing system 712 may include a variety of computer system readable media. Such media may be any available media that is accessible by computing system 712, and it includes both volatile and non-volatile media, removable and non-removable media.

For instance, system memory 723 can include computer system readable media in the form of volatile memory, such as random access memory (RAM) 730 and/or cache memory 732. Computing system 712 may further include other removable/non-removable, volatile/non-volatile computer system storage media. By way of example only, storage system 734 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 718 by one or more data media interfaces. As will be further depicted and described below, memory 723 may include at least one program product having a set (e.g., at least one) of program modules that are configured to carry out the functions of embodiments of the invention.

Program/utility 740, having a set (at least one) of program modules 742, may be stored in memory 723 by way of example, and not limitation, as well as an operating system, one or more application programs, other program modules, and program data. Each of the operating system, one or more application programs, other program modules, and program data or some combination thereof, may include an implementation of a networking environment. Program modules 742 may generally carry out the functions and/or methodologies of embodiments of the invention as described herein.

Alternatively, a separate switch configuration control module, logic, etc., 701 may be provided within computing environment 712.

Computing system 712 may electrically connect to one or more external components, such as external devices 714 and display 724 via one or more interface(s) 722. Also, in one or more implementations, the witch configuration control 701 may be provided separately, coupling to the other components of computing system 712 via bus 718, as illustrated in FIG. 7. It should also be understood that although not shown, other hardware and/or software components could be used in conjunction with detector/computing system 712. Examples, include, but are not limited to: microcode, device drivers, redundant processing units, etc.

The control aspects of the present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of aspects of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Certain aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. An electric power device comprising:
   a switchable circuit to connect to an AC voltage supply, the switchable circuit comprising multiple switchable elements;
   a sensor to ascertain a voltage level of the AC voltage supply; and
   a switch control to automatically establish a configuration of the switchable circuit based on the voltage level of the AC voltage supply, the switch control coupling the electric power device in a line-line (delta) configuration to the AC voltage supply when the voltage level is in a first voltage range, and a line-neutral (wye) configuration when the voltage level is in a second voltage range.

2. The electric power device of claim 1, further comprising a reconfigurable bridge rectifier to connect to the AC voltage supply, the reconfigurable bridge rectifier comprising the switchable circuit.

3. The electric power device of claim 2, wherein the multiple switchable elements of the switchable circuit comprise multiple silicon-controlled rectifiers, and the switch control automatically enables or disables one or more silicon-controlled rectifiers of the multiple silicon-controlled rectifiers to couple the electric power device in the line-line (delta) configuration or the line-neutral (wye) configuration to the AC voltage supply, dependent on the voltage level of the AC voltage supply.

4. The electric power device of claim 3, wherein the reconfigurable bridge rectifier further comprises multiple diodes connected in-series, with one phase input of the AC voltage supply being connected to the reconfigurable bridge rectifier between two diodes of the multiple diodes connected in-series, and wherein at least two silicon-controlled rectifiers of the multiple silicon-controlled rectifiers are connected in-series, with another phase input of the AC voltage supply being connected to the reconfigurable bridge rectifier between silicon-controlled rectifiers of the at least two silicon-controlled rectifiers.

5. The electric power device of claim 3, wherein the AC voltage supply comprises multiple phase lines and a neutral line, and the electric power device is a single-phase power supply.

6. The electric power device of claim 3, wherein the AC voltage supply is a three-phase voltage supply and the electric power device is a three-phase power supply, each phase of the three-phase power supply being connectable by the switch control for line-line operation or line-neutral operation.

7. The electric power device of claim 1, wherein the electric power device comprises a three-phase power distribution unit, the AC voltage supply is a three-phase voltage supply, and the three-phase power distribution unit comprises multiple outlet connectors which facilitate connecting multiple single-phase power supplies to the three-phase power distribution unit.

8. The electric power device of claim 7, wherein the multiple switchable elements comprise multiple triacs gated by the switch control, the multiple triacs being connected between the three-phase voltage supply and the multiple outlet connectors.

9. The electric power device of claim 7, wherein multiple switchable elements comprise multiple relays activated by the switch control, the multiple relays being connected between the three-phase voltage supply and the multiple outlet connectors.

10. The electric power device of claim 1, wherein the first voltage range is a low-voltage range, and the second voltage range is a high-voltage range, the low-voltage range being a lower voltage range than the high-voltage range.

11. The electric power device of claim 10, wherein the low-voltage range comprises 200-208 V, and the high-voltage range comprises 380-415 V.

12. A computer program product for automatically establishing configuration of a switchable circuit of an electric power device, the switchable circuit to connect to an AC voltage supply, and the switchable circuit including multiple switchable elements, the computer program product comprising:
a computer readable storage medium having program instructions embodied therewith, the program instructions being executable by a processing circuit to cause the processing circuit to:
sense a voltage level of the AC voltage supply; and
automatically establish a configuration of the switchable circuit based on the voltage level of the AC voltage supply, the automatically establishing comprising automatically coupling the electric power device in a line-line (delta) configuration to the AC voltage supply when the voltage level is in a first voltage range, and a line-neutral (wye) configuration when the voltage level is in a second voltage range.

13. The computer program product of claim 12, wherein the electric power device comprises a reconfigurable bridge rectifier to connect to the AC voltage supply, the reconfigurable bridge rectifier including the switchable circuit, and wherein the multiple switchable elements of the switchable circuit comprise multiple silicon-controlled rectifiers, and the automatically establish automatically enables or disables one or more silicon-controlled rectifiers of the multiple silicon-controlled rectifiers to couple the electric power device in the line-line (delta) configuration or the line-neutral (wye) configuration to the AC voltage supply, dependent on the voltage level of the AC voltage supply.

14. The computer program product of claim 13, wherein the electric power device comprises a power supply.

15. The computer program product of claim 12, wherein the electric power device comprises a three-phase power distribution unit, the AC voltage supply is a three-phase voltage supply, and the three-phase power distribution unit comprises multiple outlet connectors which facilitate connecting multiple single-phase power supplies to the three-phase power distribution unit, wherein the multiple switchable elements comprise multiple triacs connected between the three-phase voltage supply and the multiple outlet connectors, the automatically establishing gating the multiple triacs to couple the electric power device in the line-line (delta) configuration or the line-neutral (wye) configuration.

16. The computer program product of claim 12, wherein the electric power device comprises a three-phase power distribution unit, the AC voltage supply is a three-phase voltage supply, and the three-phase power distribution unit comprises multiple outlet connectors which facilitate connecting multiple single-phase power supplies to the three-phase power distribution unit, wherein the multiple switchable elements comprise multiple relays connected between the three-phase voltage supply and the multiple outlet connectors, the automatically establishing activating or deactivating one or more of the multiple relays to couple the electric power device in the line-line (delta) configuration or the line-neutral (wye) configuration.

\* \* \* \* \*